United States Patent
Bao et al.

(10) Patent No.: US 10,297,793 B2
(45) Date of Patent: May 21, 2019

(54) ORGANIC ELECTROLUMINESCENT DEVICE WITH FUNCTIONAL LAYERS OF DIFFERENT REFRACTIVE INDICES, AND DISPLAY APPARATUS HAVING THE SAME (71) Applicants: BOE TECHNOLOGY GROUP CO., LTD., Beijing (CN); ORDOS YUANSHENG OPTOELECTRONICS CO., LTD., Ordos (CN)

(72) Inventors: Jiandong Bao, Beijing (CN); Minhui Jia, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 220 days.

(21) Appl. No.: 15/119,894

(22) PCT Filed: Jun. 26, 2015

(86) PCT No.: PCT/CN2015/082455
§ 371 (c)(1),
(2) Date: Aug. 18, 2016

(87) PCT Pub. No.: WO2016/086651
PCT Pub. Date: Jun. 9, 2016

(65) Prior Publication Data
US 2017/0062767 A1  Mar. 2, 2017

(30) Foreign Application Priority Data
Dec. 4, 2014  (CN) .......................... 2014 1 0737404

(51) Int. Cl.
H01L 51/52 (2006.01)
H01L 51/50 (2006.01)
H01L 27/32 (2006.01)

(52) U.S. Cl.
CPC ...... *H01L 51/5271* (2013.01); *H01L 27/3244* (2013.01); *H01L 51/5012* (2013.01);
(Continued)

(58) Field of Classification Search
CPC ............. H01L 51/5271; H01L 27/3244; H01L 51/5012; H01L 51/5056; H01L 51/5072;
(Continued)

(56) References Cited

U.S. PATENT DOCUMENTS

2004/0150327 A1* 8/2004 Kawai .................... C09K 11/06
                                                              313/504
2004/0206965 A1* 10/2004 Evans .................. H01L 51/5262
                                                                257/83

(Continued)

FOREIGN PATENT DOCUMENTS

CN  102842686 A  12/2012
CN  102870249 A  1/2013
(Continued)

OTHER PUBLICATIONS

The World Intellectual Property Organization (WIPO) International Search Report For PCT/CN2015/082455 dated Sep. 10, 2015 p. 1-4.

*Primary Examiner* — Peter Bradford
(74) *Attorney, Agent, or Firm* — Anova Law Group, PLLC (57) ABSTRACT An organic electroluminescent device is provided. The organic electroluminescent device includes a transparent electrode layer; a reflective electrode layer; and an organic functional layer between the transparent electrode layer and the reflective electrode layer. The organic functional layer
(Continued)

includes an emitting-material layer for emitting light; and further includes a first medium functional layer between the emitting-material layer and the reflective electrode layer and a second medium functional layer between the first medium functional layer and the reflective electrode layer. The first medium functional layer is optically denser than the second medium functional layer; and the first medium functional layer and the second medium functional layer are configured to cause at least a part of the light emitted undergoing a total reflection at the interface between the first medium functional layer and the second medium functional layer.

20 Claims, 3 Drawing Sheets (52) U.S. Cl.
CPC ...... *H01L 51/5056* (2013.01); *H01L 51/5072* (2013.01); *H01L 51/5088* (2013.01); *H01L 51/5092* (2013.01); *H01L 51/5096* (2013.01); *H01L 51/5218* (2013.01); *H01L 51/5234* (2013.01); *H01L 51/5275* (2013.01); *H01L 2251/533* (2013.01); *H01L 2251/5315* (2013.01); *H01L 2251/55* (2013.01)

(58) Field of Classification Search
CPC ............. H01L 51/5088; H01L 51/5092; H01L 51/5096; H01L 51/5218; H01L 51/5234; H01L 51/5275; H01L 2251/5315; H01L 2251/533; H01L 2251/05

See application file for complete search history.

(56) References Cited

U.S. PATENT DOCUMENTS

| | | | |
|---|---|---|---|
| 2011/0042695 A1* | 2/2011 | Oyamada | H01L 51/5206 257/88 |
| 2011/0121272 A1 | 5/2011 | Lee et al. | |
| 2011/0204342 A1 | 8/2011 | Jeong et al. | |
| 2012/0126263 A1* | 5/2012 | Chao | H01L 51/5076 257/98 |
| 2015/0372258 A1* | 12/2015 | Mizuno | H01L 51/5218 257/40 |
| 2017/0374721 A1* | 12/2017 | Neyts | H01L 51/5012 |

FOREIGN PATENT DOCUMENTS

| | | | | |
|---|---|---|---|---|
| CN | 103682114 A | 3/2014 | | |
| CN | 104409658 A | 3/2015 | | |
| CN | 204230305 U | 3/2015 | | |
| JP | 2013030585 A | 2/2013 | | |
| JP | 2014207356 A | * 10/2014 | ......... | H01L 51/5056 |
| WO | WO-2014171313 A1 | * 10/2014 | ......... | H01L 51/5056 |

* cited by examiner

ORGANIC ELECTROLUMINESCENT DEVICE WITH FUNCTIONAL LAYERS OF DIFFERENT REFRACTIVE INDICES, AND DISPLAY APPARATUS HAVING THE SAME

CROSS-REFERENCES TO RELATED APPLICATIONS

This application is a national phase entry under 35 U.S.C. § 371 of International Application No. PCT/CN2015/082455, filed on Jun. 26, 2015, which claims priority to Chinese Patent Application No. 201410737404.9, filed on Dec. 4, 2014. The above enumerated patent applications are incorporated by reference herein in their entirety.

FIELD OF THE INVENTION

The present invention generally relates to the field of organic electroluminescence technology and, more particularly, to an organic electroluminescent device, an array substrate and a display apparatus.

BACKGROUND

Organic Light Emitting Diode (OLED) is an organic thin film electroluminescent device, and it has the advantages of simple fabrication process, low cost, high light-emitting efficiency, easy to form a flexible structure and so on. Thus, the OLED-based display technology has become an important display technology.

Figure 1:
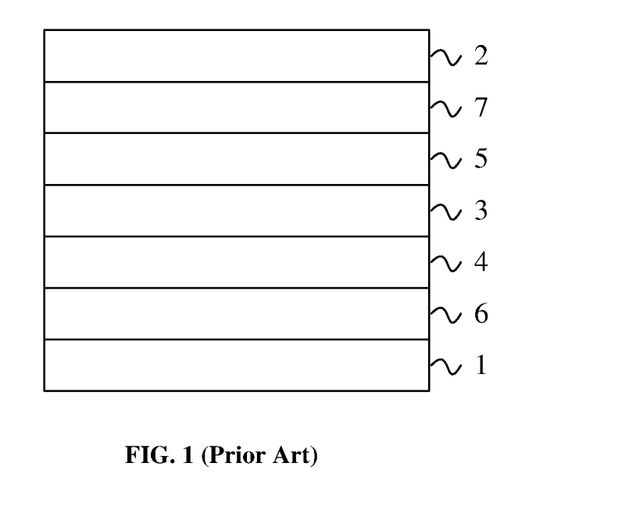
FIG. 1 illustrates a schematic structure diagram of an existing organic electroluminescent device.

As shown in FIG. 1, an organic emitting-material diode includes a cathode layer 2, an anode layer 1 and an organic functional layer sandwiched in between the cathode layer 2 and the anode layer 1. The organic functional layer includes an emitting-material layer (EML) 3, an electron injection layer (EIL) 5 and an electron transport layer (ETL) 7 formed between the emitting-material layer 3 and the cathode layer 2, and a hole transport layer (HTL) 4 and a hole injection layer (HIL) 6 formed between the organic emitting-material layer 3 and the anode layer 1.

The light-emitting mechanism for the above OLED is: when a voltage is applied between the anode layer 1 and the cathode layer 2, driven by the external voltage, the holes injected from the anode layer 1 enter the emitting-material layer 3 through the hole transport layer 4 and the hole injection layer 6, and the electrons injected from the cathode layer 2 enter the emitting-material layer 3 through the electron transport layer 5 and the electron injection layer 7. After entering the emitting-material layer 3, the holes and the electrons are recombined to form excitons in the combination area. And the light-emitting phenomenon happen during exciton's radioactive transition is defined as electroluminescence.

Since the light is emitted by the emitting-material layer in random directions, some of the light may be emitted to the opposite direction of the light emission direction of the organic electroluminescent device. In existing technologies, this part of light is simply reflected by the reflective cathode layer 2. Since this part of light travels through other film layers before reaching the reflective cathode layer 2, the light intensity is reduced or attenuated by the other layers, thereby lowering the light-emitting efficiency of the organic electroluminescent device.

The disclosed devices are directed to at least partially solve one or more problems set forth above and other problems, such as how to increase the light-emitting efficiency of the organic electroluminescent device.

BRIEF SUMMARY OF THE DISCLOSURE

According to disclosed embodiments of the present invention, total reflection is introduced in the disclosed organic electroluminescent device through the arrangement of a dense medium functional layer and a thin medium functional layer, greatly increases the reflectivity of the device, thereby directly improving the light-emitting efficiency of the organic electroluminescent device, enhancing the device's performance. Moreover, because there is less light reaching and being reflected by the reflective electrode, the reflective surface of the reflective electrode is protected, further improving the stability of the device.

One aspect of the present invention provides an organic electroluminescent device. The organic electroluminescent device includes a transparent electrode layer; a reflective electrode layer; and an organic functional layer between the transparent electrode layer and the reflective electrode layer. The organic functional layer includes an emitting-material layer for emitting light; and further includes a first medium functional layer between the emitting-material layer and the reflective electrode layer and a second medium functional layer between the first medium functional layer and the reflective electrode layer. The first medium functional layer is optically denser than the second medium functional layer; and the first medium functional layer and the second medium functional layer are configured to cause at least a part of the light emitted undergoing a total reflection at the interface between the first medium functional layer and the second medium functional layer.

Optionally, a refractive index difference between the first medium functional layer and the second medium functional layer is greater than or equal to approximately 0.03.

Optionally, the transparent electrode layer is a cathode layer and the reflective electrode layer is an anode layer.

Optionally, the first medium functional layer is a hole transport layer and the second medium functional layer is a hole injection layer.

Optionally, the organic functional layer further includes an electron blocking layer formed between the emitting-material layer and the hole transparent layer; and at least certain part of the light emitted by the emitting-material layer undergoes total reflection at the interface between the hole transport layer after traveling through the electron blocking layer.

Optionally, a refractive index difference between the electron blocking layer and the hole transport layer is greater than or equal to approximately 0.03.

Optionally, the organic functional layer further includes an electron injection layer and an electron transport layer formed between the transparent electrode layer and the emitting-material layer; and the electron injection layer is formed between the transparent electrode layer and the electron transport layer.

Optionally, the transparent electrode layer is an anode layer and the reflective electrode layer is a cathode layer.

Optionally, the first medium functional layer is an electron transport layer and the second medium functional layer is an electron injection layer.

Optionally, the organic functional layer further comprises a hole blocking layer formed between the emitting-material layer and the electron transport layer; and at least certain part of the light emitted by the emitting-material layer undergoes total reflection at the interface between the electron transport layer and the hole blocking layer after traveling through the hole blocking layer.

Optionally, a refractive index difference between the hole blocking layer and the electron transport layer is greater than or equal to approximately 0.03.

Optionally, the organic functional layer further includes a hole injection layer and a hole transport layer formed between the transparent electrode layer and the emitting-material layer; and the hole injection layer is formed between the transparent electrode layer and the hole transport layer.

Another aspect of the present invention provides an array substrate and a display apparatus. The array substrate includes the above organic electroluminescent device, and the display includes the array substrate.

Other aspects of the present disclosure can be understood by those skilled in the art in light of the description, the claims, and the drawings of the present disclosure.

DETAILED DESCRIPTION

In order for those skilled in the art to better understand the technical solutions of the present invention, the followings together with accompanying drawings describe in detail the present invention with specific embodiments.

Figure 6:
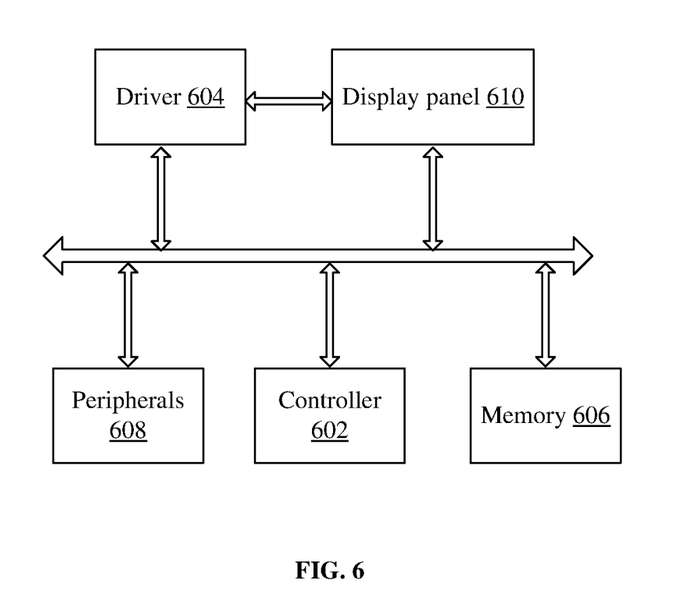
FIG. 6 illustrates a block diagram of an exemplary display apparatus.

FIG. 6 illustrates an exemplary display apparatus incorporating certain disclosed embodiments. The display apparatus may be any appropriate device or component with certain display function, such as an LCD panel, an LCD TV, a monitor, a cell phone or smartphone, a computer, a tablet, or a navigation system, etc. As shown in FIG. 6, the display apparatus includes a controller 602, driver circuitry 604, memory 606, peripherals 608, and a display panel 610. Certain devices may be omitted and other devices may be included.

The controller 602 may include any appropriate processor or processors, such as a general-purpose microprocessor, digital signal processor, and/or graphic processor. Further, the controller 602 can include multiple cores for multi-thread or parallel processing. The memory 606 may include any appropriate memory modules, such as read-only memory (ROM), random access memory (RAM), flash memory modules, and erasable and rewritable memory, and other storage media such as CD-ROM, U-disk, and hard disk, etc. The memory 606 may store computer programs for implementing various processes, when executed by the controller 602.

Peripherals 608 may include any interface devices for providing various signal interfaces, such as USB, HDMI, VGA, DVI, etc. Further, peripherals 608 may include any input and output (I/O) devices, such as keyboard, mouse, and/or remote controller devices. Peripherals 608 may also include any appropriate communication module for establishing connections through wired or wireless communication networks.

The driver circuitry 604 may include any appropriate driving circuits to drive the display panel 610. The display panel 610 may include any appropriate flat panel display, such as an LCD panel, an LED-LCD panel, a plasma panel, an OLED panel, etc. During operation, the display 610 may be provided with image signals by the controller 602 and the driver circuitry 604 for display.

In certain embodiments, the display panel 610 may include an OLED panel. The OLED panel 610 may include a substrate and an array of organic electroluminescent devices may be formed on the substrate. The substrate may also be called the array substrate.

According to disclosed embodiments of the present invention, the organic electroluminescent device includes a transparent electrode layer, a reflective electrode layer, and an organic functional layer formed between the transparent electrode layer and the reflective electrode layer.

Further, the organic functional layer includes an emitting-material layer, and an optically denser medium functional layer and an optically less dense medium functional layer formed between the emitting-material layer and the reflective electrode layer. The optically less dense medium functional layer is formed between the optically denser medium functional layer and the reflective electrode layer. Throughout the description, the following labels are used consistently: anode layer 100, cathode layer 200, emitting-material layer 300, hole transport layer 400, electron transport layer 500, hole injection layer 600, electron injection layer 700, electron blocking layer 800 and hole blocking layer 900.

When light is emitted by the emitting-material layer, the light is emitted in random directions. Some of the light may be emitted towards the transparent electrode layer and directly exits from the light emission surface of the device. However, some of the light may be emitted to directions different from the light emission direction, which can travel through the transparent electrode layer and exit from the light emission surface of the disclosed device after being reflected by the reflective electrode layer.

In general, there are some other organic functional layers formed between the emitting-material layer and the reflective electrode layer. These organic functional layers may attenuate the light intensity when the light travels through those organic functional layers to reach the reflective electrode layer before being reflected, resulting in lower light-emitting efficiency.

According to present invention, an optically denser medium (or dense medium) functional layer and an optically less dense medium (or thin medium) functional layer are sequentially placed between the emitting-material layer and the reflective electrode layer. The refractive index of the thin medium is lower than that of the dense medium. When light travels from the dense medium to the thin medium in an incident angle greater than or equal to a critical angle, a total reflection may occur at the interface between the dense medium and the thin medium.

When the light is emitted by the emitting-material layer towards the reflective electrode layer, the light may travel through sequentially the dense medium functional layer and the thin medium layer, and a total reflection may happen to some of the light at the interface between the dense medium functional layer and the thin medium functional layer.

The totally reflected light does not enter the thin medium layer, instead the reflected light can travel through the transparent electrode layer and exit from the light emission surface of the device. Thus, the light-emitting efficiency of the device is improved. Meanwhile, because of the part reflected light, less light reaches the reflective surface of the reflective electrode layer, and the reflective electrode is better protected.

In certain embodiments, a refractive index difference between the dense medium functional layer and the thin medium functional layer is greater than or equal to approximately 0.03. Under this configuration, total refection may happen with respect to desired amount of light when the emitted light enters the thin medium functional layer from the dense medium functional layer, greatly improving the light-emitting efficiency of the organic electroluminescent device and, at the same time, better protecting the reflective electrode.

Figure 2:
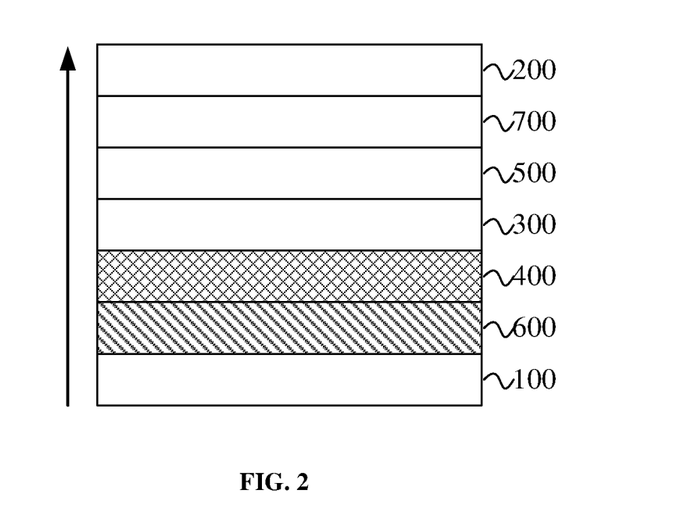
FIG. 2 illustrates a schematic structure diagram of an embodiment of the organic electroluminescent device according to the present invention.

FIG. 2 illustrates a schematic structure diagram of an exemplary embodiment of an organic electroluminescent device according to the present invention. As shown in FIG. 2, the organic electroluminescent device includes a transparent electrode layer, a reflective electrode layer, and an organic functional layer formed between the transparent electrode layer and the reflective electrode layer.

The organic functional layer includes an emitting-material layer 300, a dense medium functional layer, and a thin medium functional layer. The dense medium functional layer and the thin medium functional layer are formed between the emitting-material layer 300 and the reflective electrode layer. Further, the transparent electrode layer is a cathode layer 200, the reflective electrode layer is an anode layer 100, the dense medium functional layer is a hole transport layer 400, and the thin medium functional layer is a hole injection layer 600.

It should be noted that, because light is emitted from the emitting-material layer 300 in random directions, for illustrative purposes, the directions in which the light emitted from the emitting-material layer 300 are generally divided into two emitting directions, one direction towards the cathode layer 200, and the other direction towards the anode layer 100. The light emitted towards the cathode layer 200 may travel through the transparent cathode layer 200 and directly exits from the light emission surface of the device, and the light emitted towards the anode layer 100 may be reflected by the reflective anode layer 100 and then exits from the device.

Because the hole transport layer 400 and the hole injection layer 600 are formed between the emitting-material layer 300 and the anode layer 100, further description can be based on the analysis of the light emitted towards the anode layer 100.

When the light emitted by the emitting-material layer 300 towards the anode layer 100 enters the hole transport layer 400, the incident angles of the emitted light are different. At least part of the emitted light with the incident angle greater than or equal to the critical angle occur total reflection at the interface between the hole transport layer 400 and the hole injection layer 600, changing the travel direction towards the transparent cathode layer 200 and exiting from the light emission surface of the device. The rest of this part of the emitted light, after traveling through the hole injection layer 600, is further reflected by the reflective anode layer 100 and exits from the cathode layer 200.

During the light-emitting process, at least certain part of the light undergoes the total refection and travels back towards the cathode layer 200, so the light intensity of this part of light is not attenuated or affected by the rest of the organic functional layers. Thus, the organic electroluminescent device can have better light-emitting efficiency comparing with existing organic electroluminescent devices and, at the same time, the anode layer 100 is also being protected.

Further, a refractive index difference between the hole transport layer 400 and the hole injection layer 600 is greater than or equal to approximately 0.03, so more light may undergo total reflection when the light enters the hole injection layer 600 from the hole transport layer 400, further improving the light-emitting efficiency of the organic electroluminescent device.

It should be noted that the material for the hole transport layer 400 is a dense medium and the material for the hole injection layer 600 is a thin medium. The hole transport layer 400 and the hole injection layer 600 may be made of any appropriate optical materials.

Figure 3:
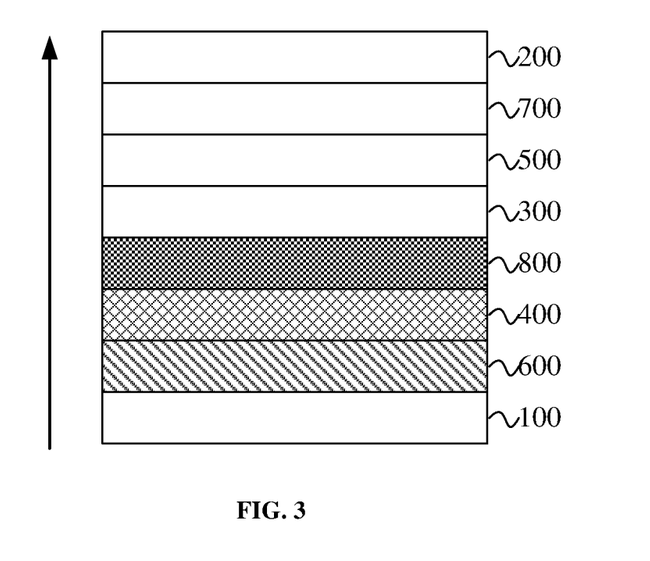
FIG. 3 illustrates a schematic structure diagram of another embodiment of the organic electroluminescent device according to the present invention.

FIG. 3 illustrates a schematic structure diagram of another embodiment of an organic electroluminescent device according to the present invention. As shown in FIG. 3, the organic electroluminescent device is based on the device structure illustrated in FIG. 1 and further includes an electron blocking layer 800 formed between the hole transport layer 400 and the light emitting layer 300. At least certain part of the light emitted by the emitting-material layer 300 undergoes total reflection at the interface between the hole transport layer 400 and the electron blocking layer 800 after traveling through the electron blocking layer 800.

When light emitted by the emitting-material layer 300 towards the anode layer 100 enters the hole transport layer 400 after traveling through the electron blocking layer 800, the incident angles of the light are different. At least a first part of the light has the incident angle greater than or equal to the critical angle. The first part of light undergoes total reflection at the interface between the hole transport layer 400 and the electron blocking layer 800, changing the travel direction towards the cathode layer 200 and exiting from the light emission surface of the device.

The rest of the emitted light towards the anode layer 100 enters the hole transport layer 400. When such light enters the hole injection layer 600 after traveling through the hole transport layer 400, at least a second part of the light may have the incident angle greater than or equal to the critical angle and undergoes total reflection at the interface between the hole injection layer 600 and the hole transport layer 400, changing the travel direction towards the cathode layer 200.

Since a considerable part of the light (the first part and the second part) undergoes total reflection at the two interfaces among the light emitted towards the anode layer 100, there is significantly less light left to reach the anode layer 100 and to be reflected back by the anode layer 100. Thus, the disclosed embodiments further reduce the light intensity attenuation, further improving the light-emitting efficiency and, at the same time, providing further protection of the anode layer 100.

Further, a refractive index difference between the electron blocking layer 800 and the hole transport layer 400 is greater than or equal to approximately 0.03 and, under such configuration, more light emitted towards the anode layer 100 may undergo total reflection at the interface between the hole transport layer 400 and the electron blocking layer 800. Therefore, the light-emitting efficiency is greatly improved. The electron blocking layer 800 and the hole transport layer 400 may be made of any appropriate materials.

In order to better recombine the electron carriers and the hole carriers in the disclosed organic electroluminescent device to improve the light-emitting efficiency, the organic functional layer may further include an electron injection layer 700 and an electron transport layer 500 formed between the transparent electrode layer and the emitting-material layer 300. The electron injection layer 700 may be disposed between the transparent electrode layer and the electron transport layer 500.

Further, the organic functional layer may include a hole blocking layer (not shown in the drawings) formed between the electron transport layer 500 and the emitting-material layer 300, which may also improve the recombination of the electron carriers and the hole carriers.

In addition, as a connection layer to a positive voltage of the organic electroluminescent device, the anode layer 100 has the characteristics of desired conductivity, high visible light reflectivity and a high work function. In general, the anode layer 100 may be made of an inorganic metal oxide such as Indium Tin Oxide (ITO), Zinc Oxide (ZnO), etc., or an organic conductive polymer such as PEDOT:PSS, PANI, etc., or a metal material with a high work function such as gold, copper, silver, platinum, etc.

As a connection layer to a negative voltage, the cathode layer 200 has the characteristics of desired conductivity and a low work function. The cathode layer 200 may generally be made of a metal material with a low work function such as Lithium, Magnesium, Calcium, Strontium, Aluminum, Indium, etc., or an alloy of a metal material with a low function value and copper, gold or silver.

Figure 4:
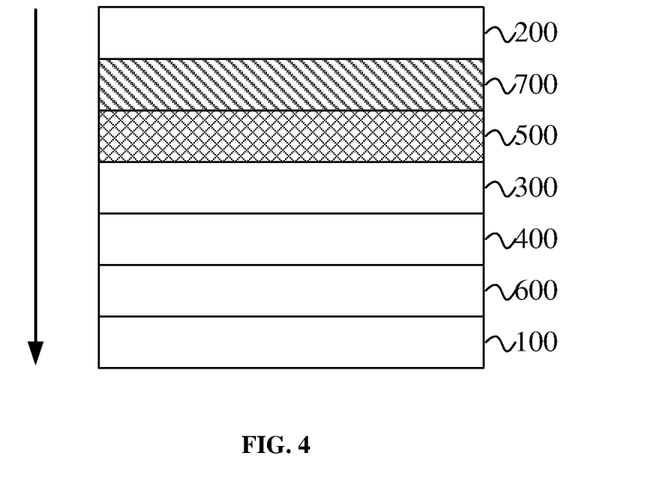
FIG. 4 illustrates a schematic structure diagram of another embodiment of the organic electroluminescent device according to the present invention.

FIG. 4 illustrates a schematic structure diagram of another exemplary embodiment of an organic electroluminescent device according to the present invention. As shown in FIG. 4, the organic electroluminescent device includes a transparent electrode layer, a reflective electrode layer, and an organic functional layer formed between the transparent electrode layer and the reflective electrode layer.

The organic functional layer includes an emitting-material layer 300, and a dense medium functional layer and a thin medium functional layer formed between the emitting-material layer 300 and the reflective electrode layer.

Further, the transparent electrode layer is an anode layer 100, the reflective electrode layer is a cathode layer 200, the dense medium functional layer is an electron transport layer 500 and the thin medium functional layer is an electron injection layer 700.

It should be noted that, because the light is emitted by the emitting-material layer 300 in random directions, for descriptive purposes, the light emitted by the emitting-material layer 300 can be generally divided into two emitting directions, one towards the anode layer 100, and one towards the cathode layer 200. The light emitted towards the anode layer 100 may travel through the transparent anode layer 100 and exits directly from the light emission surface of the disclosed device, and the light emitted towards the cathode layer 200 may be reflected by the reflective cathode layer 200 and then exits from the device.

Because the electron transparent layer 500 and the electron injection layer 700 are formed between the reflective layer and the anode layer 100, the analysis of the light emitting towards the cathode layer 200 will be provided.

When light emitted by the emitting-material layer 300 towards the cathode layer 200 enters the electron transport layer 500, the incident angles of the light are different. At least part of the emitted light with the incident angle greater than or equal to the critical angle undergoes total reflection at the interface between at the interface between the electron transport layer 500 and the electron injection layer 700, changing the travel direction towards the transparent anode layer 100 and exiting from the light emission surface of the device. The rest of the emitted light, after traveling through the electron injection layer 700, is reflected by the reflective cathode layer 200 and exits from the anode layer 100.

During this process, at least certain part of the emitted light undergoes the total refection and travels back towards the anode layer 100, so the light intensity of this part of light is not attenuated or affected by the rest of the organic functional layers. Thus, the disclosed organic electroluminescent device according to the present invention has better light-emitting efficiency comparing with existing organic electroluminescent devices and, at the same time, the cathode layer 200 is also being protected.

Further, a refractive index difference between the electron transport layer 500 and the electron injection layer 700 is greater than or equal to approximately 0.03, so more light may undergo total reflection after the light enters the electron transport layer 500. Thus, the disclosed embodiments further improve the light-emitting efficiency of the disclosed organic electroluminescent device.

It should be noted that the material for the electron transport layer 500 is a dense medium and the material for electron injection layer 700 is a thin medium. Any appropriate materials may be used.

Figure 5:
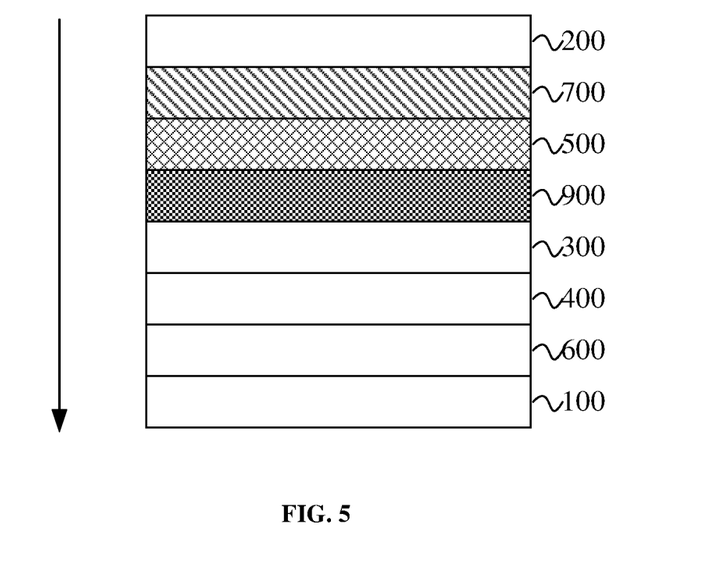
FIG. 5 illustrates a schematic structure diagram of another embodiment of the organic electroluminescent device according to the present invention.

FIG. 5 illustrates a schematic structure diagram of another embodiment of an organic electroluminescent device according to the present invention. As shown in FIG. 5, the organic electroluminescent device is based on the device structure illustrated in FIG. 4, and further includes a hole blocking layer 900 formed between the electron transport layer 500 and the light emitting layer 300.

Similarly, at least certain part of the light emitted by the emitting-material layer 300 undergoes total reflection at the interface between the hole blocking layer 900 and the electron transport layer 500 after traveling through the hole blocking layer 900.

More specifically, when light emitted by the emitting-material layer 300 towards the cathode layer 200 enters the electron transport layer 500 after traveling through the hole blocking layer 900, the incident angles of the light are different. At least certain part of the light may have the incident angles greater than or equal to the critical angle. This part of light undergoes total reflection at the interface between the electron transport layer 500 and the hole blocking layer 900, changing the travel direction towards the anode layer 100 and exiting from the light emission surface of the device.

Since a considerable part of the light undergoes total reflection at the two boundaries among all the light emitted towards the cathode layer 200, there is much less light left to reach the cathode layer 200 and to be reflected back by the cathode layer 200. Thus, the disclosed embodiments further reduce the light intensity attenuation, improving the light-emitting efficiency and at the same time providing certain protection to the cathode layer 200.

Further, a refractive index difference between the hole blocking layer 900 and the electron transport layer 500 is greater than or equal to approximately 0.03. Those skilled in the art may choose the materials for the hole blocking layer 900 and the electron transport layer 500 where their refractive index difference is greater than or equal to approximately 0.03, such that more light emitted towards the cathode layer 200 may undergo total reflection at the interface between the hole blocking layer 900 and the electron transport layer 500, exiting from the anode layer 100. Therefore, the light-emitting efficiency can be greatly improved.

In order to better recombine the hole carriers and the electron carriers in the disclosed organic electroluminescent device to improve the light-emitting efficiency, the organic functional layer may further include a block injection layer 600 and a block transport layer 400 formed between the transparent electrode layer and the emitting-material layer 300. The hole injection layer 600 is placed between the transparent electrode layer and the hole transport layer 400.

Further, the organic functional layer may also include an electron blocking layer (not shown in the drawings) between the hole transport layer 400 and the emitting-material layer 300, which may also improve the recombination of the electron carriers and the hole carriers.

In addition, according to the disclosed embodiment, as a connection layer to a positive voltage of the organic electroluminescent device, the anode layer 100 has the characteristics of good conductivity, high visible light transmittance and high work function value. In general, the anode layer 100 may be made of an inorganic metal oxide such as Indium Tin Oxide (ITO), Zinc Oxide (ZnO), etc., or an organic conductive polymer such as PEDOT:PSS, PANI, etc., or a metal material with high work function value such as gold, copper, silver, platinum, etc.

As a connection layer to a negative voltage, the cathode layer 200 has the characteristics of good conductivity, good reflectivity and low work function value. The cathode layer 200 may generally be made of a metal material with low work function value such as Lithium, Magnesium, Calcium, Strontium, Aluminum, Indium, etc., or an alloy composed of metal materials with low function value and copper, gold or silver.

It should be noted that the arrow direction shown in FIG. 2-5 is the light emission direction of the disclosed organic electroluminescent device.

By using the disclosed devices and methods, total reflection is introduced in the disclosed organic electroluminescent device through the arrangement of a dense medium functional layer and a thin medium functional layer, greatly increases the reflectivity of the device, thereby directly improving the light-emitting efficiency of the organic electroluminescent device, enhancing the device's performance. Moreover, since there is less light reaching and being reflected by the reflective electrode, the reflective surface of the reflective electrode is protected, which further improves the stability of the device. Other applications can also be implemented.

It should be noted that the above descriptions merely illustrate exemplary embodiments of the present invention. However, the present invention is not limited thereto. Without departing from the spirit and scope of the present invention, various changes and modifications made are also within the protection scope of the present invention.

What is claimed is:

1. An organic electroluminescent device, comprising:
   a transparent electrode layer;
   a reflective electrode layer; and
   an organic functional layer between the transparent electrode layer and the reflective electrode layer, wherein:
   the organic functional layer includes an emitting-material layer for emitting light; and further includes a first medium functional layer between the emitting-material layer and the reflective electrode layer and a second medium functional layer between the first medium functional layer and the reflective electrode layer;
   the first medium functional layer is in direct contact with the emitting-material layer;
   the first medium functional layer is optically denser than the second medium functional layer; and
   the first medium functional layer and the second medium functional layer are configured to cause at least a part of the light, traveling from the first medium functional layer to the second medium functional layer in an incident angle greater than or equal to a first critical angle, to undergo a total reflection at an interface between the first medium functional layer and the second medium functional layer so as to reduce light intensity attenuation.

2. The organic electroluminescent device according to claim 1, wherein a refractive index difference between the first medium functional layer and the second medium functional layer is greater than or equal to approximately 0.03.

3. The organic electroluminescent device according to claim 2, wherein the transparent electrode layer is a cathode layer and the reflective electrode layer is an anode layer.

4. The organic electroluminescent device according to claim 3, wherein the first medium functional layer is a hole transport layer and the second medium functional layer is a hole injection layer.

5. The organic electroluminescent device according to claim 3, wherein:
   the organic functional layer further comprises an electron injection layer and an electron transport layer formed between the transparent electrode layer and the emitting-material layer; and
   the electron injection layer is formed between the transparent electrode layer and the electron transport layer.

6. The organic electroluminescent device according to claim 2, wherein the transparent electrode layer is an anode layer and the reflective electrode layer is a cathode layer.

7. The organic electroluminescent device according to claim 6, wherein the first medium functional layer is an electron transport layer and the second medium functional layer is an electron injection layer.

8. The organic electroluminescent device according to claim 6, wherein:
   the organic functional layer further comprises a hole injection layer and a hole transport layer formed between the transparent electrode layer and the emitting-material layer; and
   the hole injection layer is formed between the transparent electrode layer and the hole transport layer.

9. The organic electroluminescent device according to claim 3, wherein:
   the organic functional layer further comprises a hole injection layer;
   the first medium functional layer is an electron blocking layer, and the second medium functional layer is a hole transport layer;
   the electron blocking layer is formed between the emitting-material layer and the hole transport layer;
   the hole transport layer is optically denser than the hole injection layer; and
   at least certain part of the light emitted by the emitting-material layer undergoes total reflection at an interface between the hole transport layer and the hole injection layer after traveling through the electron blocking layer and the hole transport layer in an incident angle greater than or equal to a second critical angle.

10. The organic electroluminescent device according to claim 9, wherein a refractive index difference between the hole transport layer and the hole injection layer is greater than or equal to approximately 0.03.

11. The organic electroluminescent device according to claim 6, wherein:
- the organic functional layer further comprises an electron injection layer;
- the first medium functional layer is a hole blocking layer and the second medium functional layer is an electron transport layer;
- the hole blocking layer is formed between the emitting-material layer and the electron transport layer;
- the electron transport layer is optically denser than the electron injection layer; and
- at least certain part of the light emitted by the emitting-material layer undergoes total reflection at an interface between the electron transport layer and the electron injection layer after traveling through the hole blocking layer and the electron transport layer in an incident angle greater than or equal to a third critical angle.

12. The organic electroluminescent device according to claim 11, wherein a refractive index difference between the electron transport layer and the electron injection layer is greater than or equal to approximately 0.03.

13. A display apparatus, comprising:
an array substrate containing a plurality of organic electroluminescent devices, wherein each organic electroluminescent device includes:
- a transparent electrode layer;
- a reflective electrode layer; and
- an organic functional layer between the transparent electrode layer and the reflective electrode layer, wherein:
  - the organic functional layer includes an emitting-material layer for emitting light; and further includes a first medium functional layer between the emitting-material layer and the reflective electrode layer and a second medium functional layer between the first medium functional layer and the reflective electrode layer;
  - the first medium functional layer is in direct contact with the emitting-material layer;
  - the first medium functional layer is optically denser than the second medium functional layer; and
  - the first medium functional layer and the second medium functional layer are configured to cause at least a part of the light, traveling from the first medium functional layer to the second medium functional layer in an incident angle greater than or equal to a first critical angle, to undergo a total reflection at an interface between the first medium functional layer and the second medium functional layer so as to reduce light intensity attenuation.

14. The display apparatus according to claim 13, wherein a refractive index difference between the first medium functional layer and the second medium functional layer is greater than or equal to approximately 0.03.

15. The display apparatus according to claim 14, wherein the transparent electrode layer is a cathode layer and the reflective electrode layer is an anode layer.

16. The display apparatus according to claim 15, wherein the first medium functional layer is a hole transport layer and the second medium functional layer is a hole injection layer.

17. The display apparatus according to claim 15, wherein:
- the organic functional layer further comprises a hole injection layer;
- the first medium functional layer is an electron blocking layer, and the second medium functional layer is a hole transport layer;
- the electron blocking layer is formed between the emitting-material layer and the hole transport layer;
- the hole transport layer is optically denser than the hole injection layer; and
- at least certain part of the light emitted by the emitting-material layer undergoes total reflection at an interface between the hole transport layer and the hole injection layer after traveling through the electron blocking layer and the hole transport layer in an incident angle greater than or equal to a second critical angle.

18. The display apparatus according to claim 15, wherein:
the organic functional layer further comprises an electron injection layer and an electron transport layer formed between the transparent electrode layer and the emitting-material layer; and
the electron injection layer is formed between the transparent electrode layer and the electron transport layer.

19. The display apparatus according to claim 14, wherein the transparent electrode layer is an anode layer and the reflective electrode layer is a cathode layer.

20. The display apparatus according to claim 19, wherein the first medium functional layer is an electron transport layer and the second medium functional layer is an electron injection layer.

* * * * *